US005831475A

United States Patent [19]

Myers et al.

[11] Patent Number: 5,831,475

[45] Date of Patent: Nov. 3, 1998

[54] METHOD AND APPARATUS FOR DELAY MATCHING IN A POWER AMPLIFIER

[75] Inventors: Ronald Gene Myers, Scottsdale; Bernard Eugene Sigmon, Gilbert, both of Ariz.; Frederick Herbert Raab, Burlington, Vt.

[73] Assignee: Motorola, Inc., Schaumburg, Ill.

[21] Appl. No.: 905,698

[22] Filed: Aug. 4, 1997

[51] Int. Cl.$^{6}$ .................................. H03F 3/38; H03G 3/20

[52] U.S. Cl. .................................................. 330/10; 330/136

[58] Field of Search ..................................... 330/136, 129, 330/280, 10, 207 A, 251; 375/59

[56] References Cited

U.S. PATENT DOCUMENTS

| | | | |
|---|---|---|---|
| 4,831,334 | 5/1989 | Hudspeth et al. | 330/10 |
| 5,249,201 | 9/1993 | Posner et al. | 375/59 |
| 5,251,330 | 10/1993 | Chiba et al. | 455/91 |

*Primary Examiner*—Robert Pascal
*Assistant Examiner*—Patricia T. Nguyen
*Attorney, Agent, or Firm*—Dana B. LeMoine

[57] ABSTRACT

A method and apparatus for efficient power amplification with low distortion includes a surface acoustic wave delay line (210), an envelope detector (220), an envelope amplifier (270), and a power amplifier (260). An envelope amplifier (270) includes a pulsewidth modulator (275), a driver (280), switching transistors (285), and a low pass filter (290). The surface acoustic wave delay line (210) functions to balance the delay of the envelope and the carrier of the signal to be amplified. The use of the surface acoustic wave delay line (210) obviates the need for a separate delay line in the phase path of the amplifier.

18 Claims, 3 Drawing Sheets

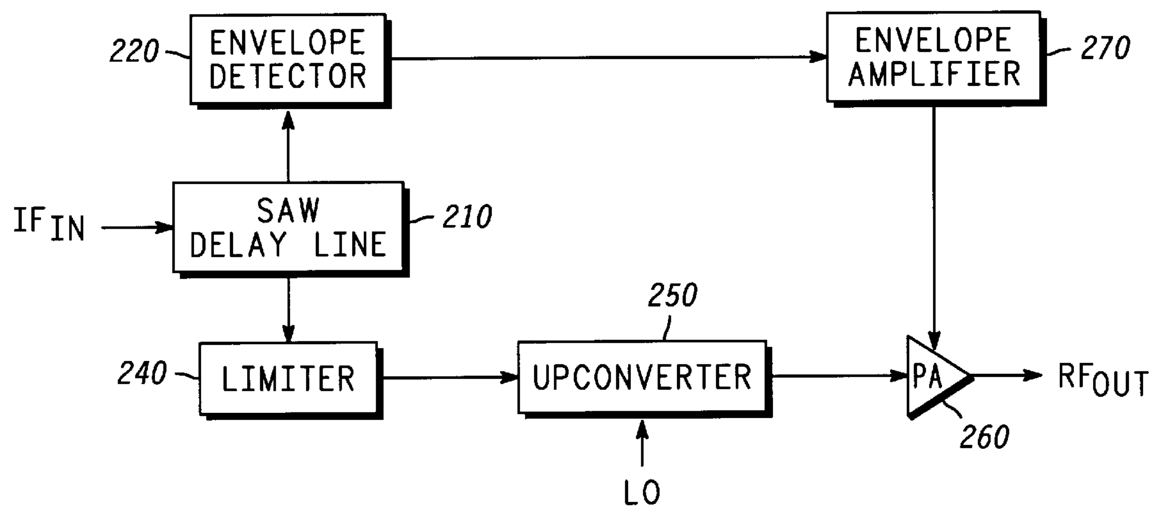
FIG. 3
FIG. 4
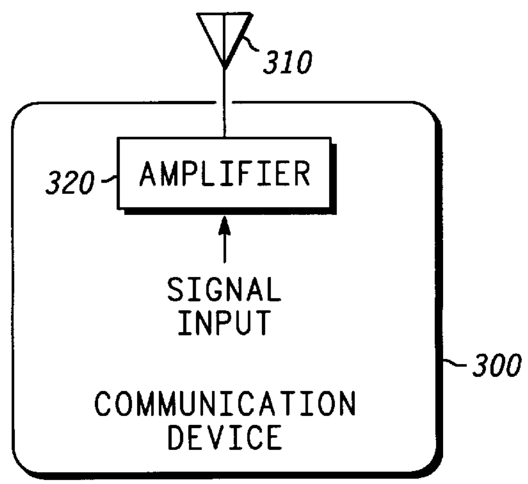

METHOD AND APPARATUS FOR DELAY MATCHING IN A POWER AMPLIFIER

FIELD OF THE INVENTION

This invention relates in general to power amplifiers and, in particular, to high efficiency power amplifiers.

BACKGROUND OF THE INVENTION

Various apparatus are available for amplifying signals. In amplifier applications that involve the amplification and transmission of modulated signals, a premium is placed on amplifier efficiency. In addition, because many modulated signals contain information in the amplitude envelope and the phase of the signal, a premium is placed on the ability to create a high fidelity reproduction of the signal. In particular, an amplifier preferably exhibits very low amplitude distortion and very low phase distortion.

Communications devices, which often transmit signals having information in both amplitude and phase, are an example of an application where these qualities are in demand. Low distortion allows the communications devices to communicate more reliably, and high efficiency allows the devices to operate longer on a single battery.

One method of achieving increased efficiency is to use envelope elimination and restoration (EER)-type amplifiers. EER is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S or other highly efficient power amplifier which only has to operate on the bandwidth of the RF envelope. The phase modulated carrier in the phase path is then amplitude modulated by the amplified envelope signal, creating an amplified replica of the input signal.

In EER-type amplifiers it is important to have the amplitude path and phase path matched well in time so that the output signal, which is reconstructed from the two paths, is a high fidelity replica of the input signal. When the two paths are not well matched in time, distortion results.

Accordingly, a need exists for an apparatus and method for matching the time delay in the amplitude and phase paths of an EER-type amplifier.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 3 shows a diagram of an amplifier in accordance with an alternate embodiment of the present invention;

FIG. 4 shows a diagram of a communications device in accordance with an embodiment of the present invention.

DETAILED DESCRIPTION OF THE DRAWINGS

Generally, the present invention helps solve the above-identified problems by providing a power amplifier circuit that amplifies the envelope of the input signal separately from the phase of the input signal, where the input signal is initially split into two paths using a delay line such as a surface acoustic wave (SAW) delay line.

Figure 1:
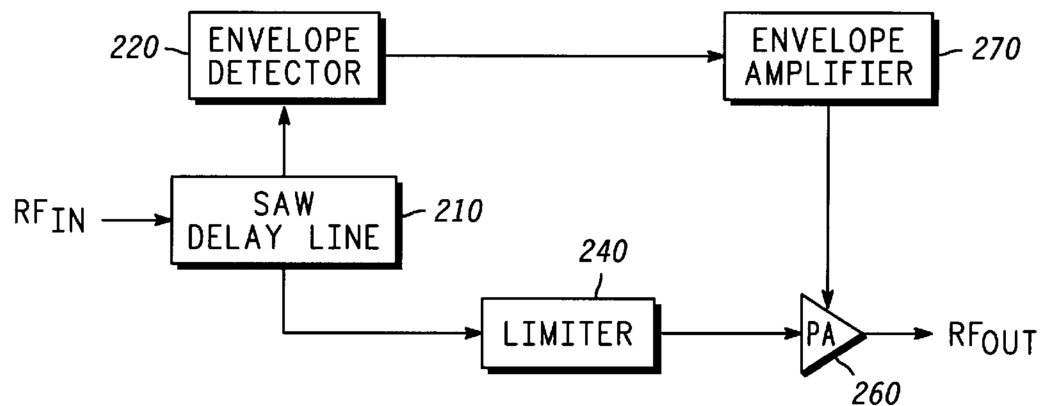
FIG. 1 shows a diagram of an amplifier in accordance with a preferred embodiment of the present invention.

FIG. 1 shows a diagram of an amplifier in accordance with a preferred embodiment of the present invention. EER-type amplifiers such as the one shown in FIG. 1 are recognized as high efficiency amplifiers.

EER-type amplifier 10 includes SAW delay line 210, envelope detector 220, envelope amplifier 270, limiter 240, and power amplifier 260. EER-type amplifier 10 receives an RF input into SAW delay line 210. SAW delay line 210 is preferably a SAW device with multiple output taps, each exhibiting a different delay from input to output. SAW delay lines typically have total delays on the order of microseconds; however, the differential delay between the output taps can be on the order of nanoseconds. SAW delay line 210 splits the RF input signal into an amplitude path which feeds envelope detector 220, and a phase path which feeds limiter 240.

The phase path of EER-type amplifier 10 includes limiter 240 and power amplifier 260. Limiter 240 receives the signal output from SAW delay line 210 and amplitude limits the signal. Limiter 240 can be omitted, or it can perform soft limiting, but limiter 240 preferably performs hard limiting so that the output of limiter 240 contains phase information with little or no amplitude information. After limiting, with the amplitude information removed, the resultant signal is the phase modulated carrier. The phase modulated carrier output from limiter 240 is input to power amplifier 260. Power amplifier 260 is any amplifier stage capable of being modulated, and it is preferably a field effect transistor (FET) amplifier. The drain of the FET is conventionally connected to a DC power source; however, as will be discussed below, in a preferred embodiment exemplified herein, the drain of the FET is driven with a signal, resulting in an amplitude modulated output signal.

Noticeably missing from the embodiment shown in FIG. 1, is the separate time delay element found in the phase path of most conventional EER-type amplifiers. The time delay element normally functions to balance the delay in the amplitude and phase paths. Because a preferred embodiment of the present invention accomplishes the delay matching by utilizing a SAW delay line with multiple output taps, the separate time delay element may be advantageously omitted. This advantageous feature of a preferred embodiment is discussed further in connection with the amplitude path and the envelope amplifier below.

The amplitude path of EER-type amplifier 10 includes envelope detector 220 and envelope amplifier 270. Envelope detector 220 detects the envelope of the RF input signal and outputs an envelope signal which represents the amplitude information contained in the original RF input signal. Envelope detector 220 is preferably a diode detector; however, other types of detectors, such as a synchronous detector based upon a double balanced mixer, could be used.

Envelope amplifier 270 amplifies the envelope signal output from envelope detector 220 and drives the drain bias of power amplifier 260. Envelope amplifier 270 amplifies the envelope signal to a level commensurate with the desired output. The output of the envelope amplifier is the power supply for power amplifier 260, and the resultant remodulation of the phase modulated carrier restores the envelope, producing an amplified replica of the input signal.

The EER-type amplifier of FIG. 1 varies the drain bias of power amplifier 260 in such a way as to maintain operation near saturation and therefore in a region of high efficiency. Because the highly efficient power amplifier 260 consumes the majority of the power consumed in EER-type amplifier 10, the entire circuit is considerably more efficient than conventional amplifiers.

Because envelope amplifier 270 only needs to operate on the bandwidth of the envelope rather than at the much higher RF bandwidth of the RF amplifier, envelope amplifier 270 can be an inexpensive and efficient amplifier with lower bandwidth requirements. One skilled in the art will recognize that there are many possible ways to implement envelope amplifier 270, but in a preferred embodiment, envelope amplifier 270 is a class S amplifier.

Figure 2:
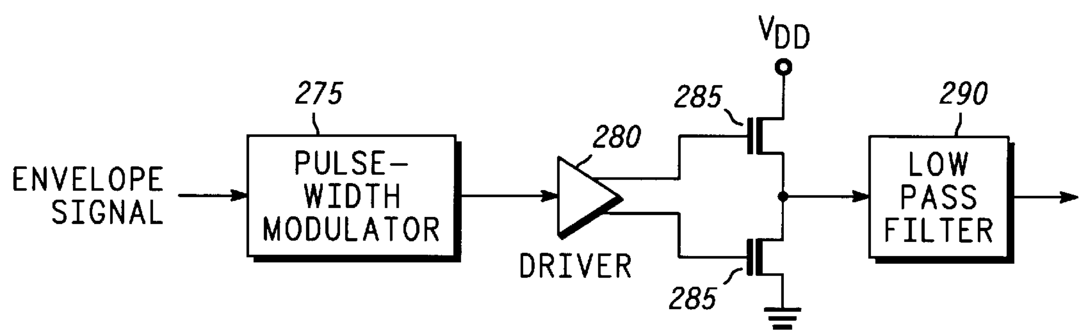
FIG. 2 shows a diagram of an envelope amplifier in accordance with a preferred embodiment of the present invention.

FIG. 2 shows a diagram of an envelope amplifier in accordance with a preferred embodiment of the present invention. Envelope amplifier 270 includes pulsewidth modulator (PWM) 275, driver 280, switching transistors 285, and low pass filter 290.

PWM 275 performs pulsewidth modulation of the envelope signal input to envelope amplifier 270 to produce a pulsewidth modulated signal which has a duty cycle proportional to the amplitude of the envelope signal. The pulsewidth modulated signal is then fed to driver 280. Switching transistors 285 and low pass filter 290, in response to driver 280, produce a signal that is an amplified version of the input to envelope amplifier 270.

In operation, EER-type amplifiers may exhibit a significant time delay in the envelope amplifier because of the delay introduced in the low pass filter following the pulsewidth modulator. For example, in a system having an envelope bandwidth of between 10 MHz and 30 MHz, typical delays in the low pass filter range from 10 ns to 45 ns.

Components in the phase path of EER-type amplifiers introduce small amounts of delay, but their sum is generally substantially less than that of the low pass filter in the amplitude path. In order to recombine the envelope in the amplitude path with the carrier in the phase path without introducing significant distortion, the delay in the two paths should be substantially matched.

The degree to which the delays in the amplitude path and phase path of the EER-type amplifier should be matched is dependent, in part, on the desired signal fidelity at the output. The closer the delay is matched, the higher the fidelity will be at the output. In a preferred embodiment, the differential delay is between 10 ns and 50 ns, and the delays are desirably matched to within 1 ns to 4 ns, depending on the switching frequency of the envelope amplifier.

Delays in this range are not readily achieved for signals of these bandwidths by existing techniques. They can, however, be achieved by a differential SAW delay line, as previously described. By utilizing a SAW delay line, a preferred embodiment of the present invention provides a delay matching mechanism capable of accommodating various delay characteristics, including a differential delay from 10 ns to 50 ns with an accuracy of 1 ns to 4 ns.

Conventional methods of solving the delay matching problem have traditionally included the use of non-SAW delay lines implemented in the phase path only, such as those implemented with coax cable or inductor capacitor (LC) delay lines. Coax cables with the desired delay of 10 to 50 ns are many feet in length and require considerable space to implement. The size of these delay lines make them impractical for use in today's small communications devices.

LC delay lines are essentially sequences of two-pole low-pass filters. To avoid distortion of the signal, the cut-off frequency of the LC delay line must be well above the highest frequency to be passed. For example, if operating at an RF frequency of 1.6 GHz, a 10 GHz cut-off frequency would be desirable. With a delay of 0.0225 ns per LC pair, an impractical total of 500 LC pairs would be necessary to achieve a delay of 11.25 ns.

For a 250 MHz cutoff frequency (operation to 50 or 100 MHz), however, each LC pair introduces a delay of about 1 ns, and a total of 11 or so would produce a total delay of 11 ns. A delay line of this type could possibly be inserted in an intermediate frequency (IF) stage, but as the total delay required increases, the number of LC pairs also increases.

The delay of SAW delay lines is typically on the order of microseconds which is an order of magnitude more than the typical 11 ns to 50 ns delay used in EER-type amplifiers. Although SAW devices with absolute delays of 11 ns to 50 ns are not currently available, SAW devices with two output taps having differential delay values of 11 ns to 50 ns are currently available. Such devices are preferably implemented on a single crystal and have one input tap and two output taps. The less-delayed signal is routed to the envelope detector, while the more-delayed signal becomes the signal in the phase path. SAW delay lines are small compared to coax cables and LC filters, so their use in communications equipment, especially handheld devices, is quite advantageous.

In the embodiment exemplified in FIG. 1, the input signal is at the final RF frequency. This results in the input signal being at RF as well as the output signal being at RF. Other possibilities include the input signal at baseband or at an IF. If the envelope and carrier are split at baseband, then the implementation of the SAW can be at baseband. Likewise, if the envelope and carrier are split at an IF, then the SAW implementation can be at that IF.

Current SAW technology performs best at frequencies below 1 GHz, so in a preferred embodiment, the input signals are preferably below 1 GHz. An alternate embodiment is discussed below in reference to FIG. 3 in which the SAW delay line can be implemented at an IF, thereby keeping the SAW delay line operating in an efficient region while accommodating higher RF frequencies.

FIG. 3 shows an amplifier in accordance with an alternate embodiment of the present invention. In FIG. 3 an IF signal is shown as the input signal to EER-type amplifier 20. The IF signal is input into SAW delay line 210. SAW delay line 210 has at least two output taps, each exhibiting a different delay from input to output. The differential delay between the two outputs of SAW delay line 210 is preferably between 10 ns and 50 ns, with an accuracy of 1 ns to 4 ns. As in the embodiment previously described, SAW delay line 210 also functions to split the input signal into the amplitude path and the phase path. The amplitude path feeds envelope detector 220, and the phase path feeds limiter 240. The output of SAW delay line 210, which exhibits a shorter delay, preferably feeds the amplitude path while the longer delayed output of SAW delay line 210 preferably feeds the phase path.

The amplitude path of EER-type amplifier 20 contains envelope detector 220 and envelope amplifier 270. These elements correspond to the elements of FIG. 1 which have like names and like reference numbers. In addition, envelope amplifier 270 corresponds to envelope amplifier 270 of FIG. 1, which was discussed in detail previously in connection with FIG. 2.

The phase path of EER-type amplifier 20 includes limiter 240, upconverter 250 and power amplifier 260. Limiter 240 and power amplifier 260 correspond to the elements shown in FIG. 1 with like names and like reference numbers. In contrast to the embodiment shown in FIG. 1, the alternate embodiment of FIG. 3 includes upconverter 250 in the phase path. Upconverter 250 receives the signal in the phase path and also receives a local oscillator (LO) signal. Upconverter 250 increases the frequency of the carrier signal to its final RF frequency using techniques well known in the art, such as the use of a mixer. The resulting signal is then used to drive power amplifier 260 which operates at the final RF frequency.

Because of the operation of upconverter 250, the amplifier of FIG. 3 takes in an IF signal at a frequency where SAW delay line 210 operates efficiently. The resulting amplifier receives an IF signal and outputs an RF signal.

In this circuit arrangement, the SAW delay line operates efficiently at an IF while continuing to obviate the need for a separate delay line in the phase path.

FIG. 4 shows a diagram of a communications device in accordance with a preferred embodiment of the present invention. Communications device 300 includes amplifier 320 and antenna 310. Amplifier 320 may be any of the low distortion amplifiers of the present invention, including for example, EER-type amplifier 10 (FIG. 1), or EER-type amplifier 20 (FIG. 3). Communications device 300 may be one of many different devices capable of communications. Examples include, but are not limited to, subscriber units in a communications system, radio receivers, transmitters, and transceivers, one-way and two-way pagers, and cellular phones.

Figure 5:
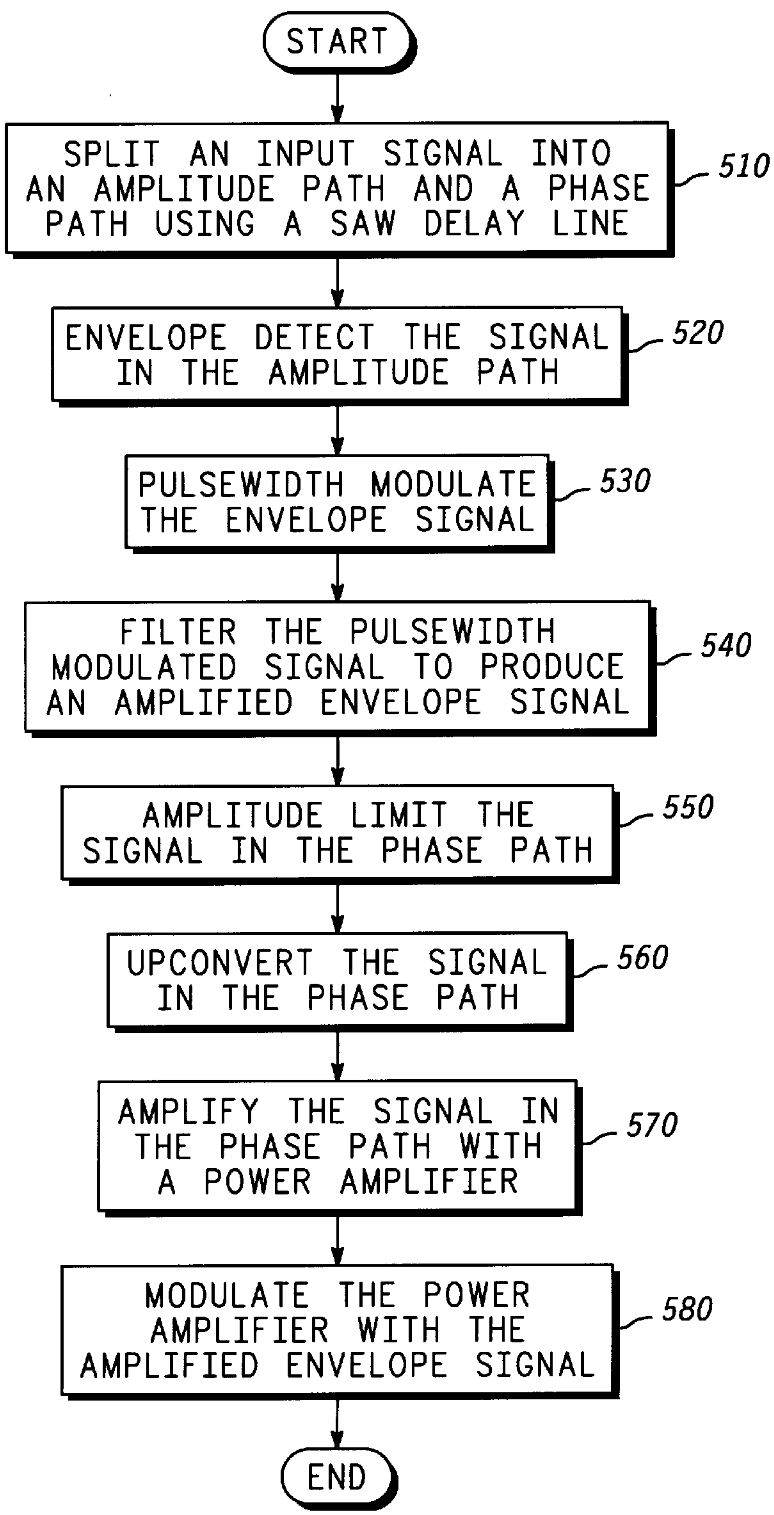
FIG. 5 shows a flow chart for a method of amplifying a signal in accordance with a preferred embodiment of the present invention.

FIG. 5 shows a flowchart for a method of amplifying a signal in accordance with a preferred embodiment of the present invention. Method 500 as shown in FIG. 5 starts with step 510. In step 510, an input signal is split into an amplitude path and a phase path using a SAW delay line. The SAW delay line of step 510 preferably exhibits differential delay between the output taps that create the amplitude path and the phase path. In a preferred embodiment, the output tap of the SAW delay line which creates the phase path has a larger delay than the output tap which creates the amplitude path.

After the input signal is split, the signal in the amplitude path is envelope detected in step 520. As a result of envelope detecting in step 520, an envelope signal is created. The envelope signal has an amplitude which reflects the time varying amplitude of the original input signal. Once the envelope signal is created, it is amplified in the following steps.

Method 500 describes specific steps for amplifying the envelope signal in a particularly highly efficient manner. It will be understood, however, that other methods of amplification of the envelope signal could be substituted. As part of the amplification process, step 530 pulsewidth modulates the envelope signal. The resulting pulsewidth modulated signal has a duty cycle which is proportional to the amplitude of the envelope signal. Then in step 540, the pulsewidth modulated signal is filtered to produce an amplified envelope signal. The resulting amplified envelope signal is an amplified replica of the envelope signal detected in step 520.

Referring now to the phase path created in step 510, in step 550 the signal in the phase path is amplitude limited. Then in step 560 the signal in the phase path is upconverted to a desired frequency for transmission. One skilled in the art will understand that step 560 is only necessary if the input signal is of a different frequency than the desired RF output signal.

In step 570 the signal in the phase path is amplified with a power amplifier. Finally, in step 580, the signals in the amplitude path and the phase path are brought back together when the power amplifier is modulated with the amplified envelope signal. This modulation can be performed in a number of ways, but in a preferred embodiment, it is performed by modulating the drain bias of a field effect transistor (FET) amplifier. In this way, the amplified envelope signal functions as the power supply of the final RF amplifier. The result is a high fidelity RF output signal which is an amplified and optionally upconverted version of the input signal.

In summary, the method and apparatus of the present invention provide an EER-type amplifier with substantially equal delays in the envelope and phase paths. The delays are matched by the advantageous use of a differential SAW delay line, thereby obviating the need for a separate delay line in the phase path. The matched delays result in the correct recombining of the envelope and the carrier and thereby increase the fidelity of the output signal. The resulting linear EER-type amplifier achieves low distortion and high efficiency. Highly efficient linear amplifiers with low distortion are very useful in the amplification of modulated signals which contain information in both amplitude and phase. Communications devices, which often transmit signals having information in both amplitude and phase, benefit greatly from the apparatus and method of the present invention. Low distortion allows the communications devices to communicate more reliably, and high efficiency allows the devices to operate longer on a single battery.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments. For example, envelope detector 220 and envelope amplifier 270 could be combined into a single function, power amplifier 260 could be comprised of many amplifier stages, or a different suitable differential delay line could be substituted for SAW delay line 210.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of amplifying a signal, said method comprising the steps of:

splitting an input signal into an envelope signal and a carrier signal, where said splitting is performed by a device comprising a delay line;

amplifying said envelope signal to produce an amplified envelope signal; and modulating said carrier signal with said amplified envelope signal.

2. The method of claim 1 wherein said amplifying step comprises:

producing a pulsewidth modulated signal with a duty cycle proportional to said envelope signal; and filtering said pulsewidth modulated signal to produce said amplified envelope signal.

3. The method of claim 1 further comprising the step of:

prior to said modulating step, amplitude limiting said carrier signal.

4. The method of claim 1 further comprising the step of:

prior to said modulating step, upconverting said carrier signal.

5. The method of claim 1 wherein said modulating step comprises the steps of:

amplifying said carrier signal with a power amplifier; and modulating said power amplifier with said amplified envelope signal.

6. The method of claim 1 wherein said splitting is performed by a device comprising a surface acoustic wave delay line.

7. An amplifier comprising:

a delay line having an input, a first delayed output, and a second delayed output;

an envelope detector for detecting an envelope of a signal output from said first delayed output of said delay line, said envelope detector producing an input envelope signal;

an envelope amplifier for amplifying said input envelope signal and producing an amplified envelope signal; and a power amplifier for amplifying a signal output from said second delayed output of said delay line, wherein said power amplifier is modulated by said amplified envelope signal.

8. The amplifier of claim 7 wherein said delay line comprises a surface acoustic wave delay line.

9. The amplifier of claim 7 wherein said envelope amplifier is a class S amplifier.

10. The amplifier of claim 7 further comprising a limiter coupled between said second delayed output of said delay line and said power amplifier.

11. The amplifier of claim 7 further comprising an upconverter coupled between said second delayed output of said delay line and said power amplifier.

12. The amplifier of claim 7 wherein said envelope amplifier comprises:

a pulsewidth modulator which produces a pulsewidth modulated signal with a duty cycle proportional to said input envelope signal; and a filter for filtering said pulsewidth modulated signal to produce said amplified envelope signal.

13. A communications device including an amplifier wherein said amplifier comprises:

a delay line having an input, a first delayed output, and a second delayed output;

an envelope detector for detecting an envelope of a signal output from said first delayed output of said delay line, said envelope detector producing an input envelope signal;

an envelope amplifier for amplifying said input envelope signal and producing an amplified envelope signal; and a power amplifier for amplifying a signal output from said second delayed output of said delay line, wherein said power amplifier is modulated by said amplified envelope signal.

14. The communications device of claim 13 wherein said delay line comprises a surface acoustic wave delay line.

15. The communications device of claim 13 wherein said envelope amplifier is a class S amplifier.

16. The communications device of claim 13 further comprising a limiter coupled between said second delayed output of said delay line and said power amplifier.

17. The communications device of claim 13 further comprising an upconverter coupled between said second delayed output of said delay line and said power amplifier.

18. The communications device of claim 13 wherein said envelope amplifier comprises:

a pulsewidth modulator which produces a pulsewidth modulated signal with a duty cycle proportional to said input envelope signal; and a filter for filtering said pulsewidth modulated signal to produce said amplified envelope signal.

* * * * *